United States Patent
Yoon

(10) Patent No.: US 8,018,566 B2
(45) Date of Patent: Sep. 13, 2011

(54) METHOD FOR FABRICATING AN IN-PLANE SWITCHING MODE LIQUID CRYSTAL DISPLAY WHEREIN THE UPPER AND LOWER PIXEL ELECTRODES ARE FORMED ON OPPOSITE SIDES OF THE RESPECTIVE UPPER AND LOWER PIXEL REGIONS

(75) Inventor: Sang-Pil Yoon, Gyeongsangbuk-Do (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 12/950,690

(22) Filed: Nov. 19, 2010

(65) Prior Publication Data

US 2011/0063565 A1    Mar. 17, 2011

Related U.S. Application Data

(62) Division of application No. 11/783,740, filed on Apr. 11, 2007, now Pat. No. 7,859,629.

(30) Foreign Application Priority Data

Apr. 12, 2006    (KR) .................. 10-2006-0033355

(51) Int. Cl.
*G02F 1/1343*    (2006.01)

(52) U.S. Cl. ....................... 349/141; 349/144

(58) Field of Classification Search .................. 349/141, 349/144
See application file for complete search history.

(56) References Cited

U.S. PATENT DOCUMENTS

| | | | |
|---|---|---|---|
| 2005/0099571 | A1 | 5/2005 | Hong et al. |
| 2005/0162579 | A1 | 7/2005 | Jeong et al. |
| 2005/0264744 | A1 | 12/2005 | Kim et al. |
| 2005/0286003 | A1 | 12/2005 | Lee et al. |
| 2006/0279668 | A1 | 12/2006 | Paik et al. |
| 2006/0290863 | A1 | 12/2006 | HoeSup |

FOREIGN PATENT DOCUMENTS

| | | |
|---|---|---|
| CN | 1619393 | 5/2005 |
| CN | 1716067 | 1/2006 |

*Primary Examiner* — Mark A Robinson
*Assistant Examiner* — Dennis Y Kim
(74) *Attorney, Agent, or Firm* — McKenna Long & Aldridge LLP

(57) ABSTRACT

An in-plane switching (IPS) mode liquid crystal display (LCD) and its fabrication method are disclosed. Common lines are formed at upper and lower portions of a pixel region to reduce a line width of the common lines and to reduce resistance of the common lines. A gate line is formed at the center of the pixel region to divide the pixel region into two regions in which pixel electrode connection lines and common electrode connection lines are arranged to crisscross each other to thus improve a luminance characteristic due to a parasitic capacitance deflection.

15 Claims, 12 Drawing Sheets

METHOD FOR FABRICATING AN IN-PLANE SWITCHING MODE LIQUID CRYSTAL DISPLAY WHEREIN THE UPPER AND LOWER PIXEL ELECTRODES ARE FORMED ON OPPOSITE SIDES OF THE RESPECTIVE UPPER AND LOWER PIXEL REGIONS

CROSS-REFERENCE TO RELATED APPLICATIONS

This application is a Divisional of application Ser. No. 11/783,740 filed Apr. 11, 2007 now U.S. Pat. No. 7,859,629, now allowed, which claims priority to Korean Patent Application No. 10-2006-0033355, filed Apr. 12, 2006, all of which are hereby incorporated by reference for all purposes as if fully set forth herein.

BACKGROUND OF THE INVENTION

1. Field of the Invention

The present invention relates to an in-plane switching mode liquid crystal display (LCD) and its fabrication method. More particularly, the present invention relates to an in-plane switching (IPS) mode LCD and its fabrication method capable of improving picture quality by enhancing a luminance characteristic and also capable of reducing resistance of common lines.

2. Discussion of the Related Art

As consumer interest in information displays is growing and the demand for portable (mobile) information devices is increasing, research and commercialization of light and thin flat panel displays ("FPD") has also increased. Among FPDs, the liquid crystal display ("LCD") is a device for displaying images by using optical anisotropy of liquid crystal. LCD devices exhibit excellent resolution and color and picture quality. So, the LCD device may be widely applied for notebook computers or desktop monitors, and the like.

The LCD includes a color filter substrate, an array substrate and a liquid crystal layer formed between the color filter substrate and the array substrate.

The color filter substrate includes a color filter having a plurality of sub-color filters that implement red, green and blue colors, a black matrix for dividing the sub-color filters and blocking light transmission through the liquid crystal layer, and a transparent common electrode for applying voltage to the liquid crystal layer.

The array substrate includes gate lines and data lines which are arranged vertically and horizontally to define a plurality of pixel regions, TFTs, switching elements, formed at respective crossings of the gate lines and the data lines, and pixel electrodes formed on the pixel regions.

The color filter substrate and the array substrate are attached in a facing manner by a sealant (not shown) formed at an edge of an image display region to form a liquid crystal panel. The attachment of the color filter substrates and the array substrate is made by an attachment key formed on the color filter substrate or the array substrate.

The above described LCD is an example of a twisted nematic (TN) type LCD in which nematic liquid crystal molecules are driven in a direction perpendicular to the substrates. The TN type LCD has shortcomings in that its viewing angle is quite narrow. This results from refractive anisotropy of liquid crystal molecules such that when a voltage is applied to a liquid crystal display panel, liquid crystal molecules which have been aligned horizontally to the substrates are aligned substantially in the vertical direction to the substrates.

Thus, an in-plane switching (IPS) mode LCD, in which liquid crystal molecules are driven in a horizontal direction to the substrates has been introduced to improve the viewing angle.

FIG. 1 is a plan view showing a portion of an array substrate of the related art IPS mode LCD. The N number of gate lines and the M number of data lines are formed to cross each other to define the M×N number of pixels on an array substrate. One pixel is shown on the drawing merely for the sake of brevity.

FIG. 2 is an exemplary view showing a cross-section take along line I-I' of the array substrate in FIG. 1, in which the array substrate and the color filter substrate attached to the array substrate are shown together.

As shown in FIGS. 1 and 2, a gate line 16 and a data line 17 are formed vertically and horizontally to define a pixel region on the transparent array substrate 10, and a TFT (T), a switching element, is formed at the crossing of the gate line 16 and the data line 17.

The TFT (T) includes a gate electrode 21 connected with a gate line 16, a source electrode 22 connected to the data line 17 and a drain electrode 23 connected to a pixel electrode 18 via a pixel electrode line 18l. The TFT also includes a first insulation film 15a for insulating the gate electrode 21, source and drain electrodes 22 and 23, and an active pattern 24 for forming a conductive channel between the source electrode 22 and the drain electrode 23 by a gate voltage supplied to the gate electrode 21.

Reference numeral 25 denotes an ohmic contact layer for ohmic-contacting between source and drain regions of the active pattern 24 and the source and drain electrodes 22 and 23.

In the pixel region, a common line 8l and a storage electrode 18s are arranged in a direction parallel to the gate line 16, and a plurality of common electrodes 8 and a plurality of pixel electrodes 18 are arranged to be parallel to the data line 17 and generate an in-plane field 90 to switch the liquid crystal molecules 30.

The plurality of common electrodes 8 are simultaneously formed with the gate line 16 and connected to the common line 8l, and the plurality of pixel electrodes 18 are simultaneously formed with the data line 17 and connected to the pixel electrode line 18l and the storage electrode 18s.

The pixel electrodes 18 connected to the pixel electrode line 18l are electrically connected to the drain electrode 23 of the TFT (T) via the pixel electrode line 18l.

The storage electrode 18s overlaps a portion of the lower common line 8l with the first insulation film 15a interposed therebetween to form a storage capacitor Cst.

On a transparent color filter substrate 5, there are formed a black matrix 6 for preventing a leakage of light to the TFT (T), the gate line 16 and the data line 17, and a color filter 7 for implementing red, green and blue colors.

An alignment film (not shown) for determining an initial alignment direction of the liquid crystal molecules 30 is coated on facing surfaces of the array substrate 10 and the color filter substrate 5.

In the related art in-plane mode LCD having the above-described structure, the common electrodes 8 and the pixel electrodes 18 are formed on the same array substrate 10 to generate the in-plane field. As such, the viewing angle can be improved.

However, because the common electrodes 8 and the pixel electrodes 18 made of an opaque material are disposed in the pixel region for image display, an aperture ratio is degraded which degrades luminance.

In addition, the in-plane field is not normally formed within the pixel region due to a signal interference between the data line 17 and the pixel electrode 18. So, in order to prevent this, the line width of the common electrode 8 adjacent to the data line 17 is increased, which, however, further degrades the aperture ratio.

SUMMARY OF THE INVENTION

Accordingly, the present invention is directed to an in-plane switching mode liquid crystal display and fabrication method thereof that substantially obviates one or more of the problems due to limitations and disadvantages of the related art.

One advantage of the present invention is to provide an in-plane switching (IPS) mode liquid crystal display (LCD) and its fabrication method capable of reducing parasitic capacitance generated between data lines and pixel electrodes by forming common electrodes and pixel electrodes in a direction to be substantially perpendicular to data lines.

Another advantage is to provide an IPS mode LCD and its fabrication method capable of improving an aperture ratio by forming common electrodes and pixel electrodes with a transparent conductive material.

Still another advantage is to provide an IPS mode LCD and its fabrication method capable of reducing a left and right deflection of parasitic capacitance generated between data lines and pixel electrodes.

Yet another advantage is to provide an IPS mode LCD and its fabrication method capable of reducing resistance of common lines by forming the common lines at both upper and lower portions of a pixel region.

Another advantage is to provide an IPS mode LCD and its fabrication method capable of improving on-current characteristics by increasing a channel width (W) of thin film transistors.

Additional features and advantages of the invention will be set forth in the description which follows, and in part will be apparent from the description, or may be learned by practice of the invention. These and other advantages of the invention will be realized and attained by the structure particularly pointed out in the written description and claims hereof as well as the appended drawings.

To achieve these and other advantages and in accordance with the purpose of the present invention, as embodied and broadly described, a method for fabricating an IPS mode LCD comprises: providing first and second substrates; forming a gate electrode and a gate line on the first substrate and forming an upper common line and a lower common line respectively at upper and lower sides of the gate line; forming an active pattern and source and drain electrodes on the first substrate and forming a data line substantially crossing the gate line to define upper and lower pixel regions; forming a second insulation film on the first substrate; forming a plurality of upper common electrodes and a plurality of upper pixel electrodes in the upper pixel region and forming a plurality of upper common electrodes and a plurality of lower pixel electrodes in the lower pixel region; and attaching the first and second substrates.

In another embodiment of the invention, an IPS mode LCD comprises: a gate electrode and a gate line on a first substrate and an upper common line and a lower common line respectively at upper and lower sides of the gate line; a first insulation film on the first substrate; an active pattern on the first substrate; source and drain electrodes on the substrate and a data line substantially crossing the gate line to define upper and lower pixel regions; a second insulation film on the first substrate; a plurality of upper common electrodes and a plurality of pixel electrodes in the upper pixel region, and a plurality of lower common electrodes and a plurality of lower pixel electrodes in the lower pixel region; upper and lower first connection lines and upper and lower second connection lines being arranged crisscross with respect to the upper and lower pixel regions; and a second substrate attached with the first substrate.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE ILLUSTRATED EMBODIMENTS

The in-plane switching (IPS) mode liquid crystal display (LCD) and its fabrication method will now be described in detail with reference to the accompanying drawings.

Figure 1:
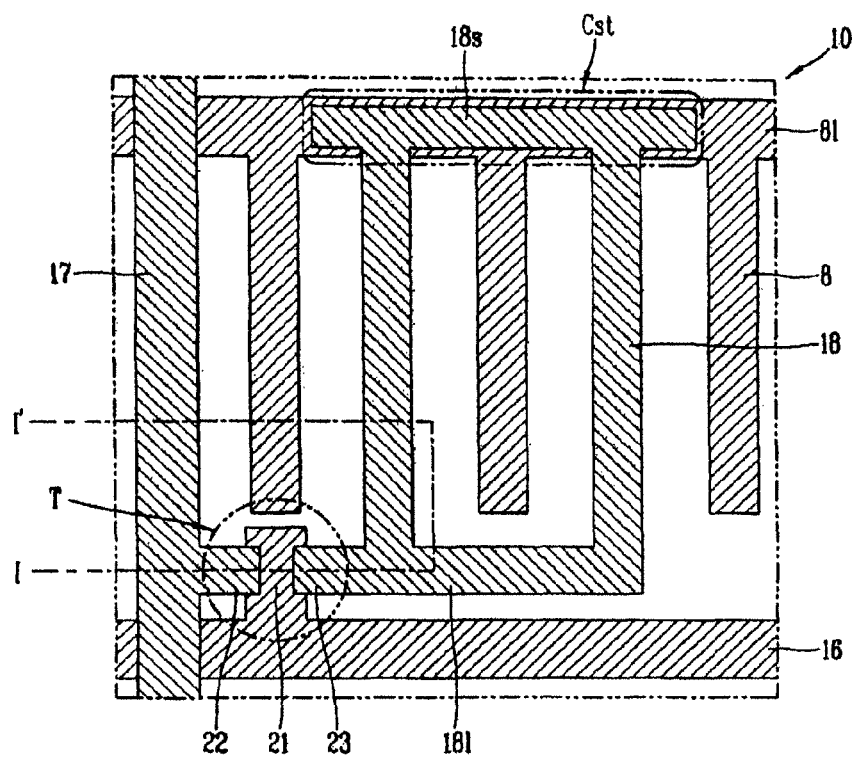
FIG. 1 is a plan view showing a portion of an array substrate of a related art in-plane switching (IPS) mode liquid crystal display (LCD)
Figure 2:
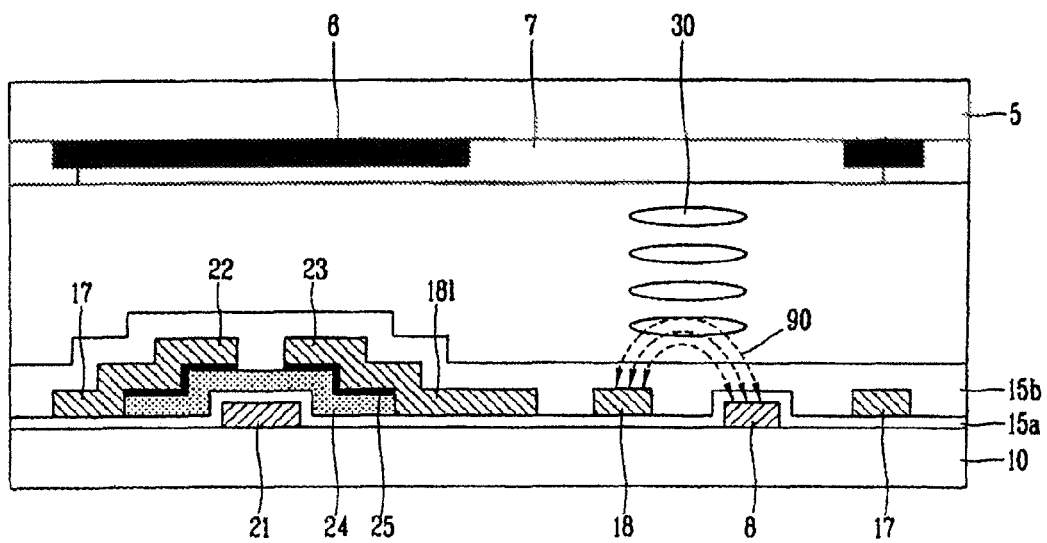
FIG. 2 is a cross-sectional view schematically showing the structure of the related art IPS mode LCD.
Figure 3:
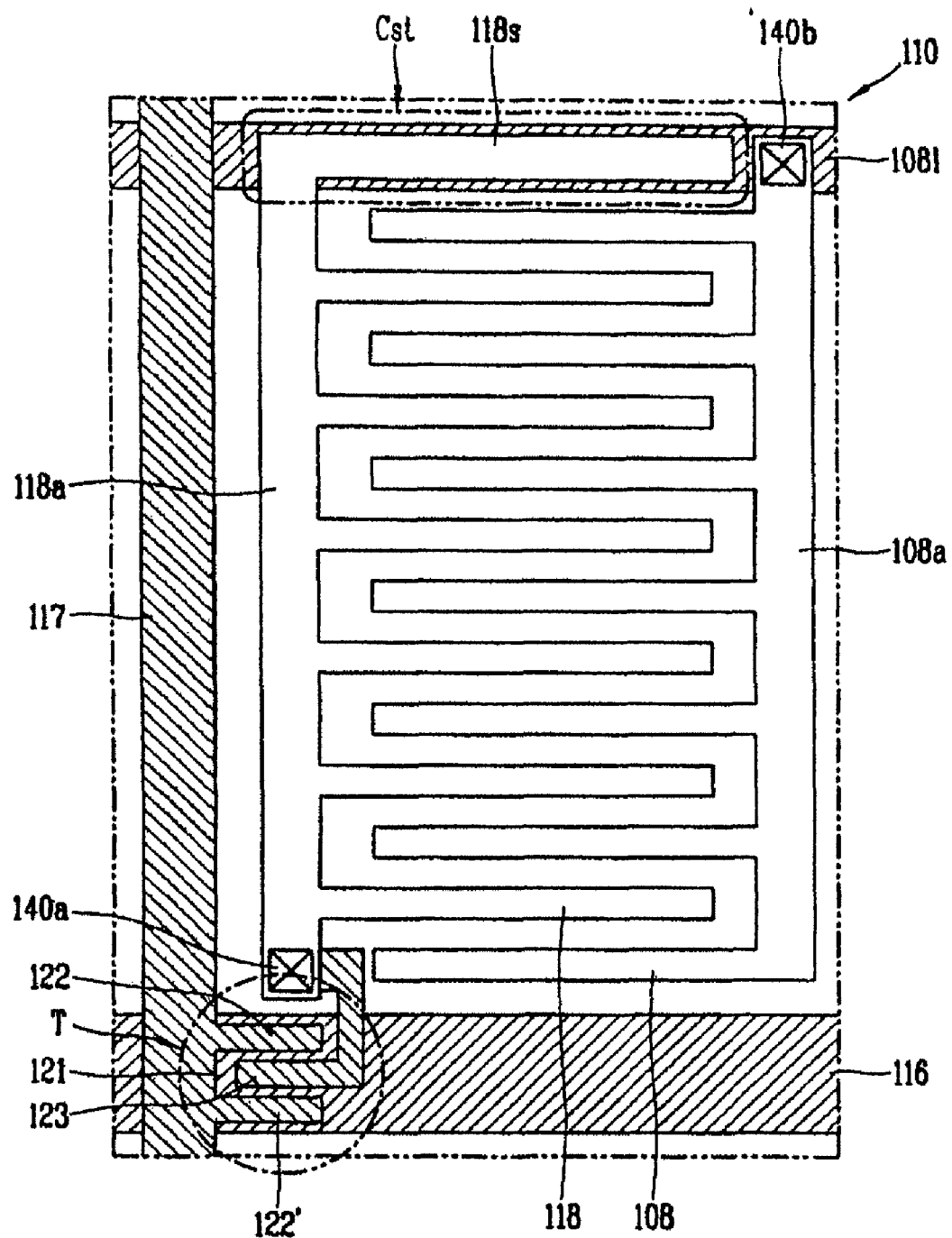
FIG. 3 is a plan view showing a portion of an array substrate of an IPS mode LCD according to a first embodiment of the present invention.

FIG. 3 is a plan view showing a portion of an array substrate of the IPS mode LCD according to a first embodiment of the present invention. The N number of gate lines and M number of data lines are formed to cross each other to define M×N number of pixels on an array substrate. One pixel is shown on the drawing merely for the sake of brevity.

As shown, in the first embodiment of the present invention, gate lines 116 and data lines 117 are formed to be arranged vertically and horizontally to define a pixel region on an array substrate 110. A thin film transistor (TFT) (T), a switching element, is formed at a crossing of the gate line 116 and the data line 117.

The TFT (T) includes a gate electrode 121 formed at a portion of the gate line 116, a pair of source electrodes 122 and 122' connected to the data line 117, and a drain electrode 123 connected to a pixel electrode 118 via a first connection line 118a. The TFT (T) also includes a first insulation film (not shown) for insulating the gate electrode 121, the source and drain electrodes 122, 122' and 123), and an active pattern (not shown) that forms a conductive channel between the source electrodes 122 and 122' and the drain electrode 123 by a gate voltage supplied to the gate electrode 121.

The source electrodes 122 and 122' are formed in a substantially "⊏"type channel shape with the drain electrode 123 positioned therebetween to increase a channel width (W) of the TFT. As a result, on-current characteristics of the TFT can be improved.

At an upper side of the pixel region, a common line 108l and a storage electrode 118s are formed to be substantially parallel to the gate line 116. In the pixel region, a plurality of common electrodes 108 and the pixel electrodes 118 that generate in-plane fields are alternately formed. In this case, the common electrodes 108 and the pixel electrodes 118 are arranged to be substantially parallel to the gate line 116.

The plurality of pixel electrodes 118 are connected to the first connection line 118a arranged to be substantially parallel to the data line 117, and the plurality of common electrodes 108 are connected to a second connection line 108a arranged to be substantially parallel to the data line 117. Namely, the plurality of pixel electrodes 118 are connected to the first connection line 118a arranged to be substantially parallel to the data line 117 at a left edge of the pixel region and the plurality of common electrodes 108 are connected with the second connection line 108a arranged to be substantially parallel to the data line 117 at a right edge of the pixel region.

The first connection line 118a is electrically connected with a portion of the drain electrode 123 via a first contact hole 140a formed at the second insulation film (not shown), and the second connection line 108a is electrically connected with the common line 108l via a second contact hole 140b formed at the first and second insulation films.

In the first embodiment of the present invention, the first connection line 118a is formed at the left side of the pixel region and the second connection line 108a is formed at the right side of the pixel region. However, without being limited thereto, in the present invention, the first connection line 118a can be formed at the right side of the pixel region while the second connection line 108a can be formed at the left side of the pixel region.

A portion of the common line 108l overlaps with a portion of the storage electrode 118s with the first insulation or the first and second insulation films interposed therebetween to form a storage capacitor Cst. The storage capacitor serves to uniformly maintain a voltage applied to a liquid crystal capacitor until a next signal is applied.

The storage capacitor Cst has the effect of stabilizing gray scale representation and reducing flickering and a residual image, as well as maintaining signals.

In the IPS mode LCD according to the first embodiment of the present invention, because the common electrodes 108 and the pixel electrodes 118 are formed to be substantially perpendicular to the data lines 117, a signal interference between the data lines 103 and the pixel electrodes 118 can be reduced.

In addition, because the common electrodes 108 and the pixel electrodes 118 are made of a transparent conductive material, an aperture ratio can be improved compared with the related art.

Moreover, because the common electrodes 108 and the pixel electrodes 118 are formed on the same plane, a stronger in-plane field than that of the related art can be generated and applied to the liquid crystal layer between the common electrodes 108 and the pixel electrodes 118. Because liquid crystal molecules in the liquid crystal layer can be switched faster by the stronger in-plane field, a moving picture or the like can be more easily implemented.

In the IPS mode LCD according to the first embodiment of the present invention, the first connection line 118a for connecting the pixel electrodes is formed only at a left or right side of the pixel region, so it is affected only by a signal of a data line 117 of a corresponding pixel or a data line of an adjacent pixel.

An IPS mode LCD according to a second embodiment of the present invention, a first connection line for connecting the pixel electrodes and a second connection line for connecting the common electrodes are arranged to cross at two upper and lower regions of the pixel region so that the first and second connection lines are not wholly affected by a data line of a corresponding pixel or a data line of an adjacent pixel but affected by half of them to thereby improve a luminance change.

Figure 4:
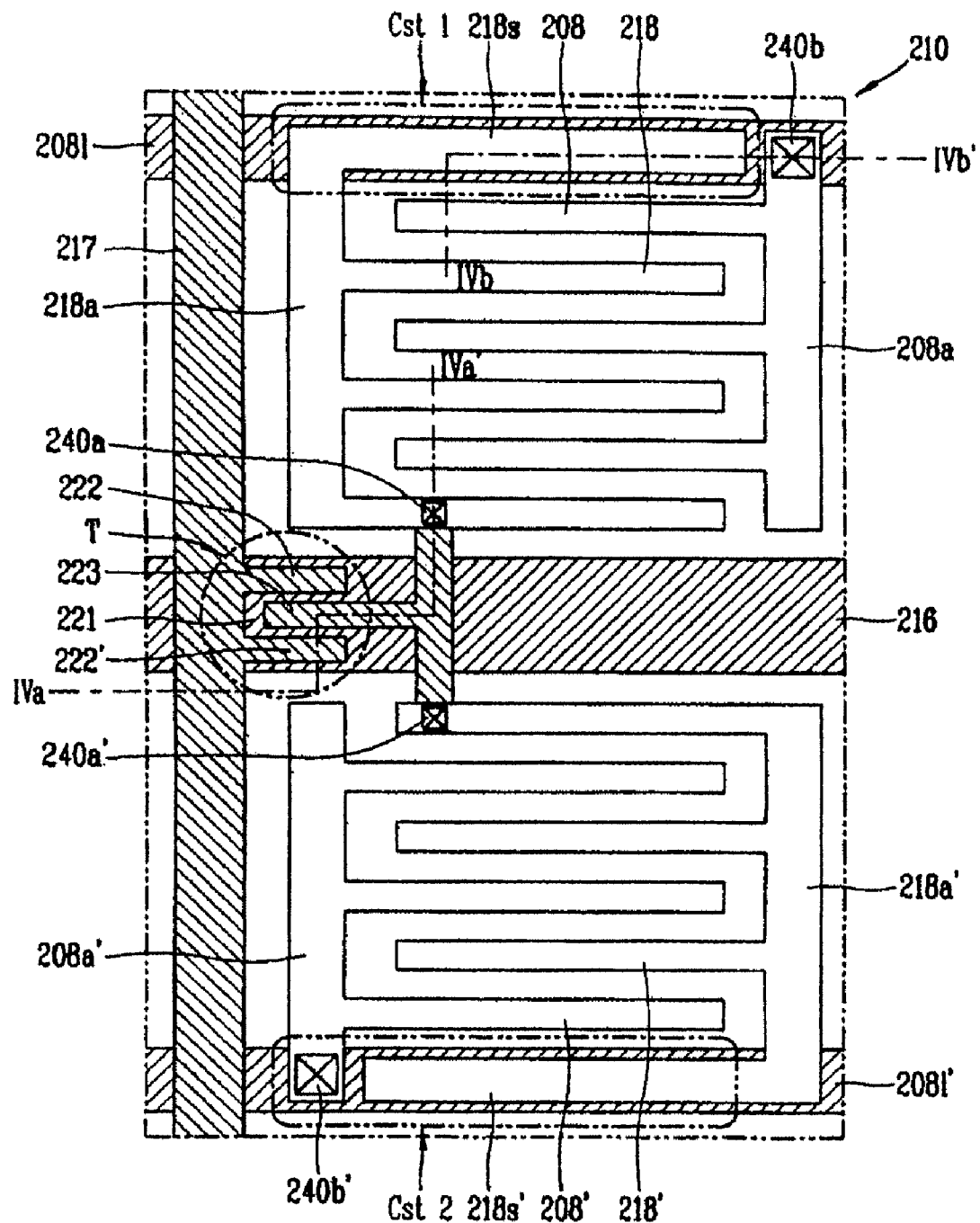
FIG. 4 is a plan view showing a portion of an array substrate of an IPS mode LCD according to a second embodiment of the present invention.

FIG. 4 is a plan view showing a portion of an array substrate of the IPS mode LCD according to the second embodiment of the present invention. The N number of gate lines and M number of data lines are formed to cross each other to define the M×N number of pixels on an array substrate. One pixel is shown on the drawing merely for the sake of brevity.

As shown, in the second embodiment of the present invention, gate line 216 and data line 217 are formed to be arranged vertically and horizontally to define a pixel region on an array substrate 210, and a thin film transistor (TFT) (T), a switching element, is formed at a crossing of the gate line 216 and the data line 217.

The gate line 216 is formed at the center of the pixel region, dividing the pixel region into two upper and lower regions.

The TFT (T) includes a gate electrode 221 forming a portion of the gate line 216, a pair of source electrodes 222 and 222' connected to the data line 217, and a drain electrode 223 connected to pixel electrodes 218 and 218' via first connection lines 218a and 218a'. The TFT (T) also includes a first insulation film (not shown) for insulating the gate electrode 221, the source and drain electrodes 222, 222' and 223, and an active pattern (not shown) that forms a conductive channel between the source electrodes 222 and 222' and the drain electrode 223 by a gate voltage supplied to the gate electrode 221.

Similar to the first embodiment of the present invention described above, the source electrodes 222 and 222' are formed in a substantially "⊏" type channel shape with the drain electrode 123 positioned therebetween to increase a channel width (W) of the TFT. As a result, on-current characteristics of the TFT can be improved.

Upper and lower sides of the pixel region are divided into two regions by the gate line 216, and common lines 208l and 208l' and storage electrodes 218s and 218s' are formed to be substantially parallel to the gate line 216. In addition, at the pixel region, a plurality of common electrodes 208 and 208' and the pixel electrodes 218 and 218' that generate in-plane fields are formed in an alternating pattern.

In this embodiment, the common electrodes 208 and 208' and the pixel electrodes 218 and 218' are arranged to be substantially parallel to the gate line 216.

In the second embodiment of the present invention, because the common lines 208l and 208l' are formed at upper and lower portions of the pixel region, a line width of the common lines 208l and 208l' can be substantially increased to reduce resistance of the common lines 208l and 208l'.

The plurality of pixel electrodes 218 and 218' are connected to the first connection lines 218a and 218a' arranged to be substantially parallel to the data line 217, and the plurality of common electrodes 208 and 208' are connected to the second connection lines 208a and 208a' arranged to be substantially parallel to the data line 217.

In the second embodiment of the present invention, the first connection lines 218a and 218a' for connecting the pixel electrodes and the common lines 208l and 208l' for connecting the common electrodes are arranged to cross at the upper and lower portions of the pixel region. Namely, the upper pixel electrode 218 is connected to the upper first connection line 218a arranged to be substantially parallel to the data line 217 at the left edge of the pixel region, and the lower pixel electrode 218' is connected to the lower first connection line 218a' arranged to be substantially parallel to the data line 217 at the right edge of the pixel region. The upper common electrode 208 is connected to the upper second connection line 208a arranged to be substantially parallel to the data line 217 at the right edge of the pixel region, and the lower common electrode 208' is connected with the lower second connection line 208a' arranged to be substantially parallel to the data line 217 at the left edge of the pixel region.

Because the gate line 216 is formed at the center of the pixel region to divide the pixel region into two upper and lower regions and the first connection lines 218a and 218a' for connecting the pixel electrodes and the second connection lines 208a and 208a' for connecting the common electrodes are arranged to cross with respect to the two divided regions, deflection of left and right parasitic capacitances can be reduced. As a result, a luminance change of the LCD can be improved. Namely, compared with the related art, the first and second connection lines 218a and 218a' and 208a and 208a', respectively, are not wholly affected by a data line of a corresponding pixel or a data line of an adjacent pixel, but affected by half of them to thereby improve the luminance characteristic.

The upper first connection line 218a and the lower first connection line 218' are electrically connected to a portion of the drain electrode 223 via an upper first contact hole 240a and a lower first contact hole 240a' respectively formed at the second insulation film (not shown), and the upper second connection line 208a and the lower second connection line 208a' are electrically connected to the upper common line 208l and the lower common line 208l' via an upper second contact hole 240b and a lower second contact hole 240b' respectively formed at the first and second insulation films.

A portion of the upper common line 208l overlaps with a portion of an upper storage electrode 218s with the first insulation film or the first and second insulation films interposed therebetween, forming a first storage capacity Cst1, and a portion of the lower common line 208l' overlaps with a portion of the lower storage electrode 218s' with the first insulation film or the first and second insulation films interposed therebetween, forming a second storage capacitor Cst2.

FIGS. 5A to 5D are cross-sectional views sequentially illustrating fabrication processes taken along lines IVa-IVa' and IVb-IVb' of the array substrate in FIG. 4, and FIGS. 6A to 6D are plan views sequentially showing fabrication processes of the array substrate in FIG. 4.

Figure 5A:
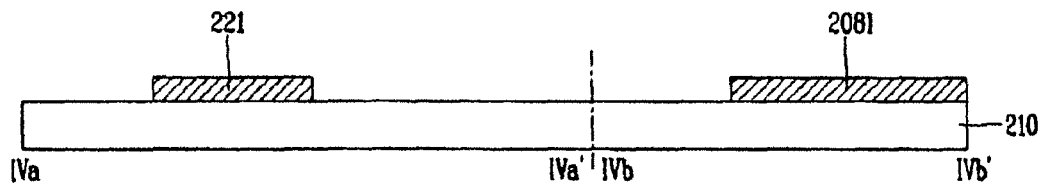
FIGS. 5A to 5D are cross-sectional views sequentially showing fabrication processes taken along lines IVa-IVa' and IVb-IVb' of the array substrate in FIG. 4.
Figure 6A:
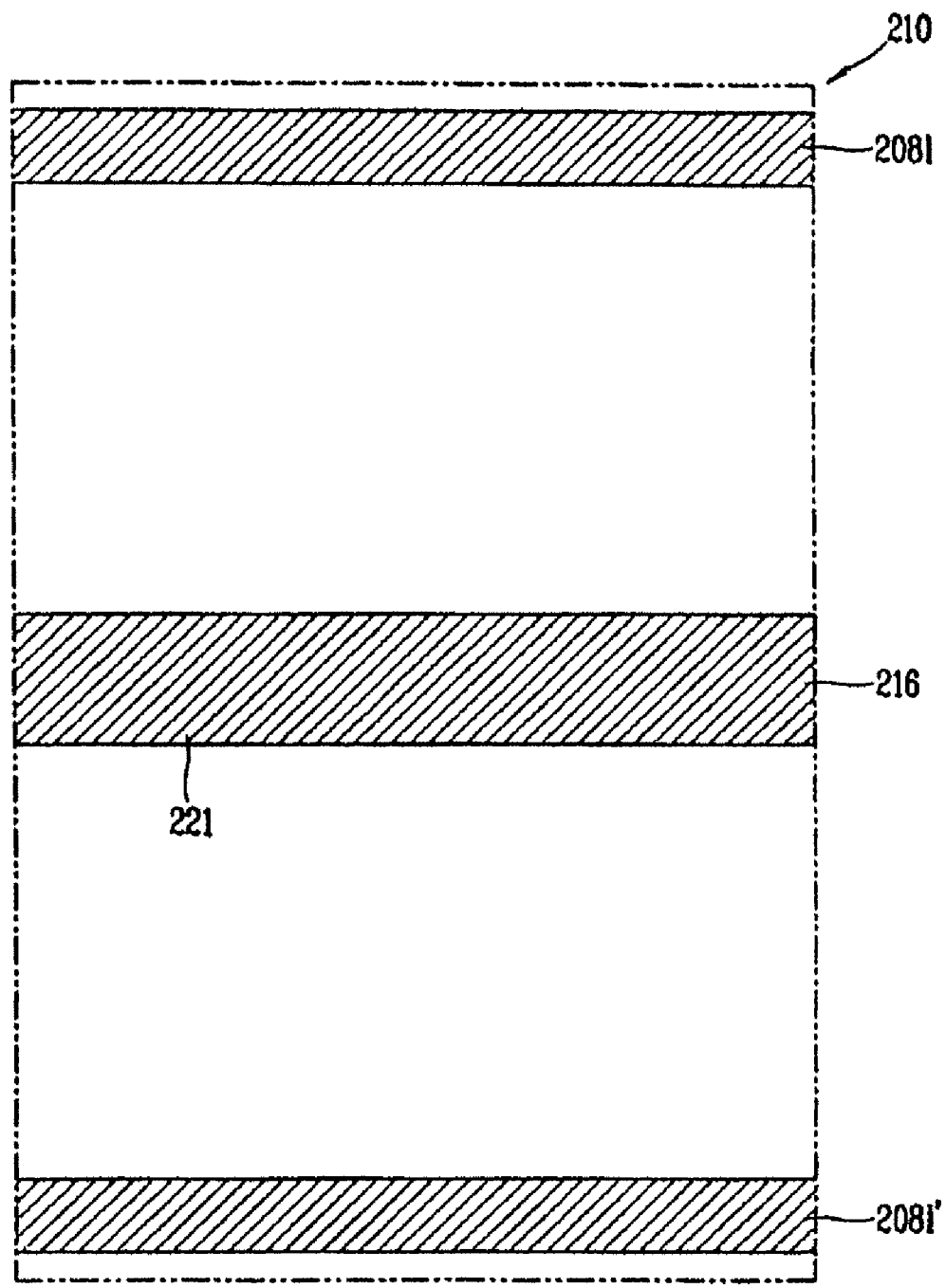
FIGS. 6A to 6D are plan views sequentially showing fabrication processes of the array substrate in FIG. 4.

As shown in FIGS. 5A and 6A, the gate electrode 221, the gate line 216 and the common lines 208l and 208l' are formed on the substrate 210 made of a transparent material such as glass.

The gate electrode 221, the gate line 216 and the common lines 208l and 208l' are formed by depositing a first conductive film on an entire surface of the substrate 210 and patterning it using a photolithography process (a first masking process).

Herein, the first conductive film can be made of a low-resistance opaque conductive material such as aluminum (Al), an aluminum alloy, tungsten (W), copper (Cu), chromium (Cr) and molybdenum (Mo), etc. Also, the gate electrode 221, the gate line 216 and the common lines 208l and 208l' can be formed to have a multi-layered structure by stacking two or more low-resistance conductive materials.

The gate electrode 221 forms a portion of the gate line 216, and the upper and lower common lines 208l and 208l' formed at upper and lower portions of the pixel region can be formed to be substantially parallel to the gate line 216.

Figure 5B:
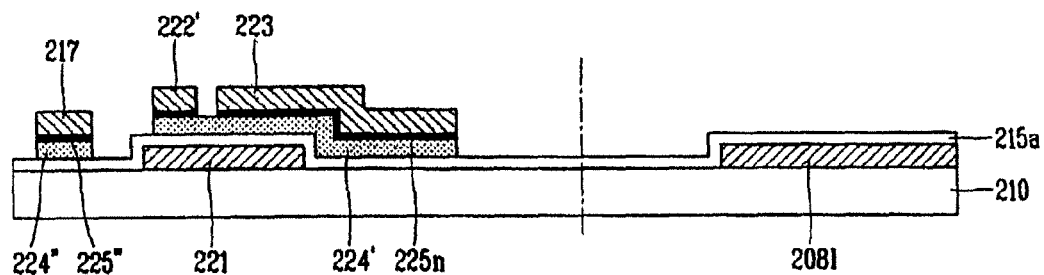
Figure 6B:
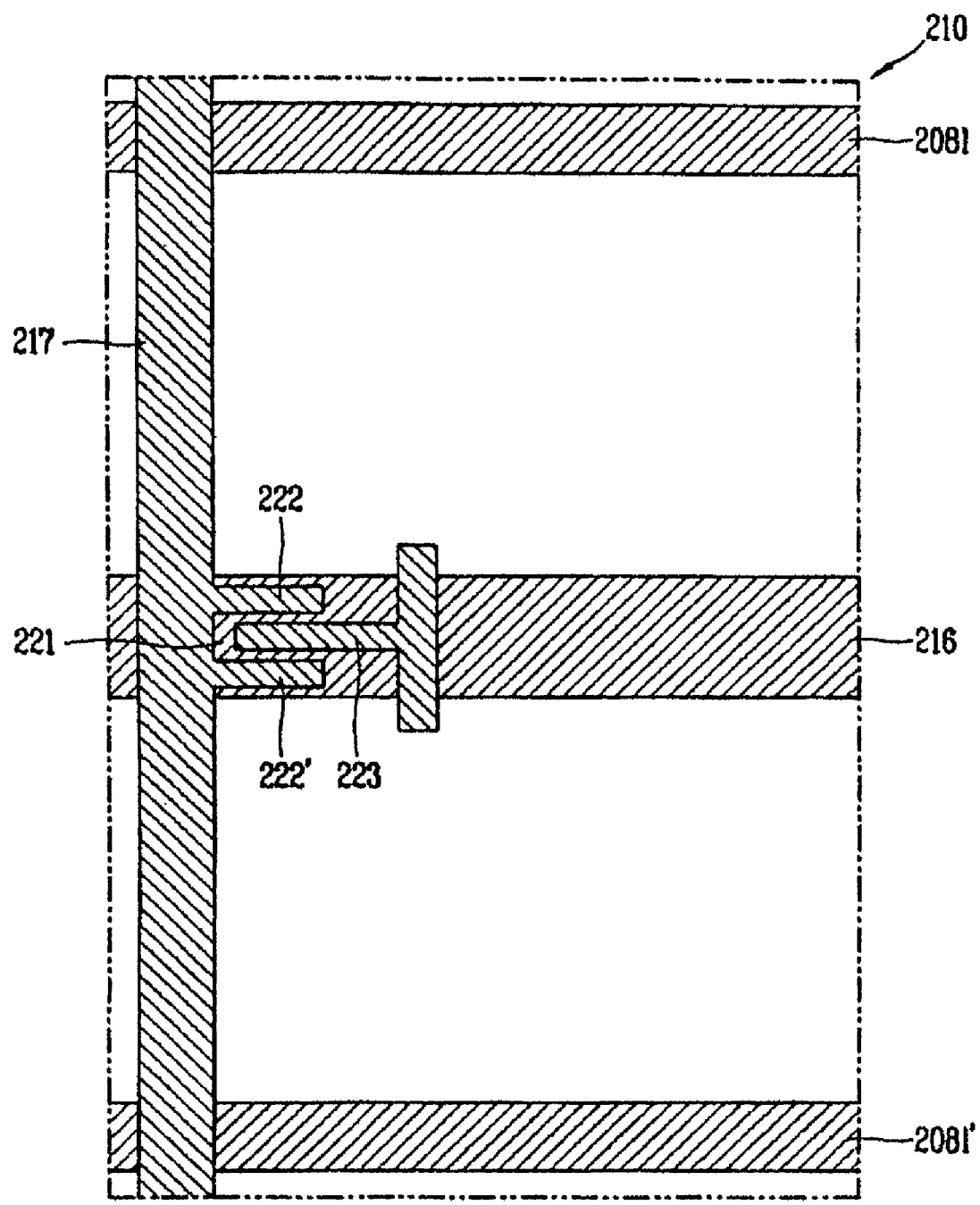

Next, as shown in FIGS. 5B and 6B, a first insulation film 215a, an amorphous silicon thin film 224, an n+ amorphous silicon thin film 225 and a second conductive film are sequentially deposited on the entire surface of the substrate 210 with the gate line 216 and the common lines 208l and 208l' formed thereon, and the amorphous silicon thin film, the n+ amorphous silicon thin film and the second conductive film are selectively patterned using the photolithography process (a second masking process) to form an active pattern 224' formed of the amorphous silicon thin film. At the same time, the pair of source electrodes 222 and 222' and the drain electrode 223 at an upper portion of the gate electrode 221 are formed.

An ohmic-contact layer 225n which is made of the n+ amorphous silicon thin film and allows certain regions of the lower active pattern 224' and the source and drain electrodes 222, 222' and 223 to be ohmic-contacted is formed upon being patterned in the same shape as the source and drain electrodes 222, 222' and 223. In this case, a portion of the source electrodes 222 and 222' is connected with the data line 217 that crosses the gate line 216 to define the pixel region.

In the second embodiment of the present invention, the active pattern 224' and the source and drain electrodes 222, 222' and 223 are simultaneously formed through a single masking process (the second masking process) using a slit (diffraction) mask or half-tone mask, which will now be described with reference to the accompanying drawings.

FIGS. 7A to 7E are cross-sectional views illustrating a second masking process in FIGS. 5B and 6B in detail.

Figure 7A:
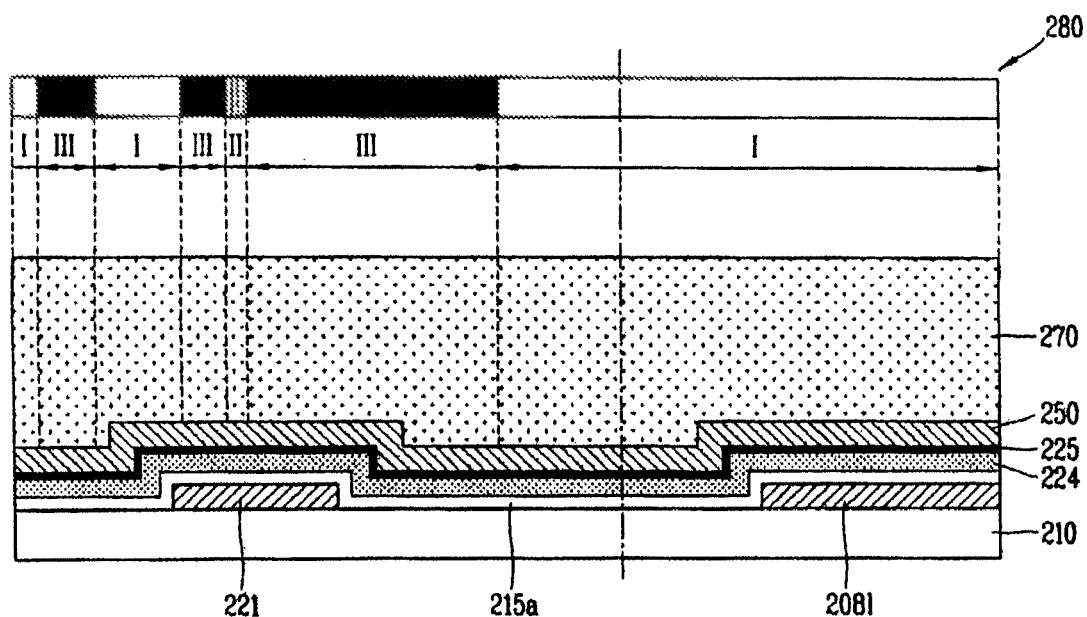
FIGS. 7A to 7E are cross-sectional views showing a second masking process in FIGS. 5B and 6B in detail.

As shown in FIG. 7A, the first insulation film 215a, the amorphous silicon thin film 224, the n+ amorphous silicon thin film 225 and the second conductive film 250 are sequentially deposited on the entire surface of the substrate 210 on which the gate electrode 221, the gate line 216 and the common lines 208l and 208l' have been formed.

In this case, the second conductive film 250 can be made of a low-resistance opaque conductive material such as aluminum, an aluminum alloy, tungsten, copper, chromium, molybdenum and molybdenum alloy, etc.

Thereafter, a photosensitive film 270 made of a photosensitive material such as photoresist is formed on the entire surface of the substrate 210, onto which light is selectively irradiated using a slit mask (or a half-tone mask) 280.

The slit mask 280 used in the second embodiment of the present invention includes a transmission region (I) that allows irradiated light to be entirely transmitted therethrough, a slit region (II) that allows only some light to be transmitted therethrough while blocking the remaining light, and a blocking region (III) that entirely blocks the irradiated light. Only light which has transmitted through the slit mask 280 can be irradiated on the photosensitive film 270.

Figure 7B:
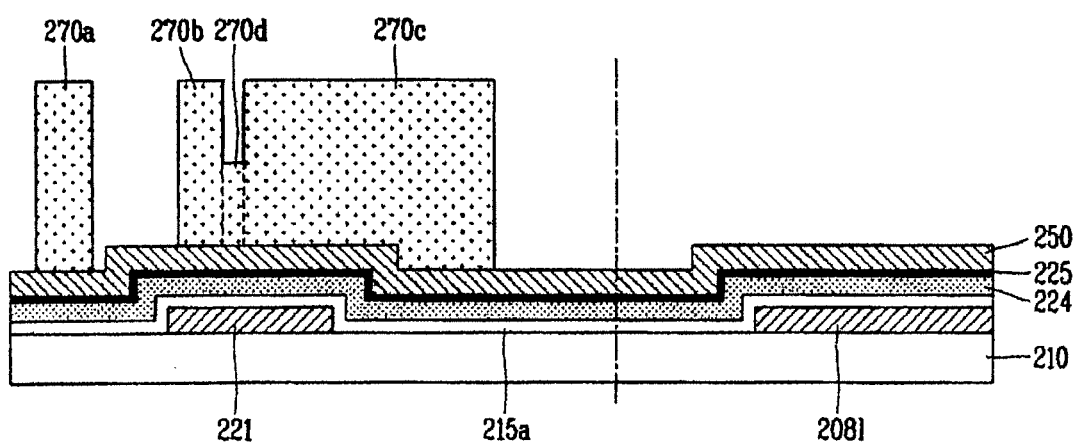

Subsequently, when the photosensitive film 270 which has been exposed through the slit mask 280 is developed, as shown in FIG. 7B, photosensitive film patterns 270a to 270d with a certain thickness remain at regions where light was entirely blocked or partially blocked through the blocking region (III) and the slit region (II), and the photosensitive film at the transmission region (I) through which light was entirely transmitted has been completely removed to expose the surface of the second conductive film 250.

At this time, the first to third photosensitive film patterns 270a to 270c formed at the blocking region (III) are thicker than the fourth photosensitive film pattern 270d formed through the slit region (II). In addition, the photosensitive film at the region where the light entirely transmitted through the transmission region (I) has been completely removed. This is because positive photoresist was used, but without being limited thereto, negative photoresist can be also used in the present invention.

Figure 7C:
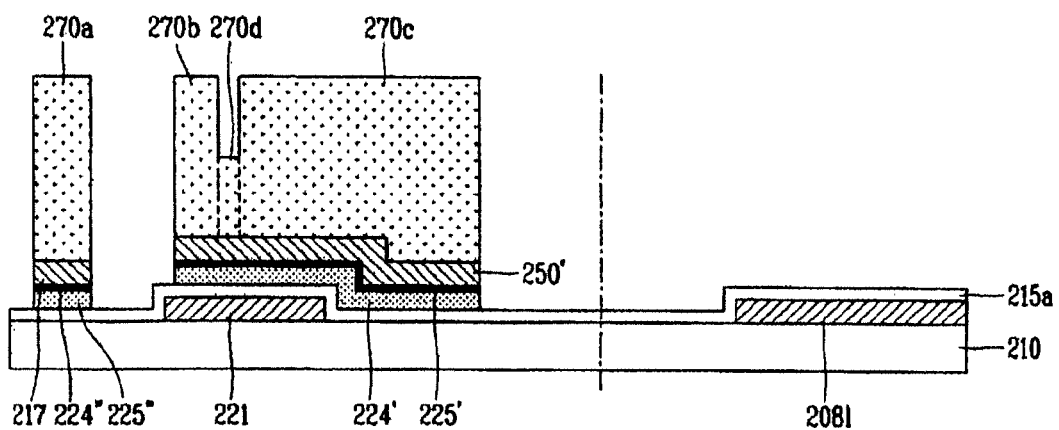

Thereafter, the lower amorphous silicon thin film 224, the n+ amorphous silicon thin film 225 and the second conductive film 250 are selectively removed using the thusly formed photosensitive film patterns 270a to 270d as masks to form the active pattern 224' formed of the amorphous silicon thin film at a certain upper region of the gate line 221 and at the same time the data line 217 formed of the second conductive film at a region that substantially crosses the gate line 216, as shown in FIG. 7C.

At this time, a first n+ amorphous silicon thin film pattern 225' and a second conductive film pattern 250' are formed of the n+ amorphous silicon thin film and the second conductive film which have been patterned in the same shape as the active pattern 224' at the upper portion of the active pattern 224'. At a lower portion of the data line 217, there are formed an amorphous silicon thin film pattern 224" and a second n+ amorphous silicon thin film pattern 225" formed of the amorphous silicon thin film and the n+ amorphous silicon thin film and patterned in the same shape as the data line 217.

Figure 7D:
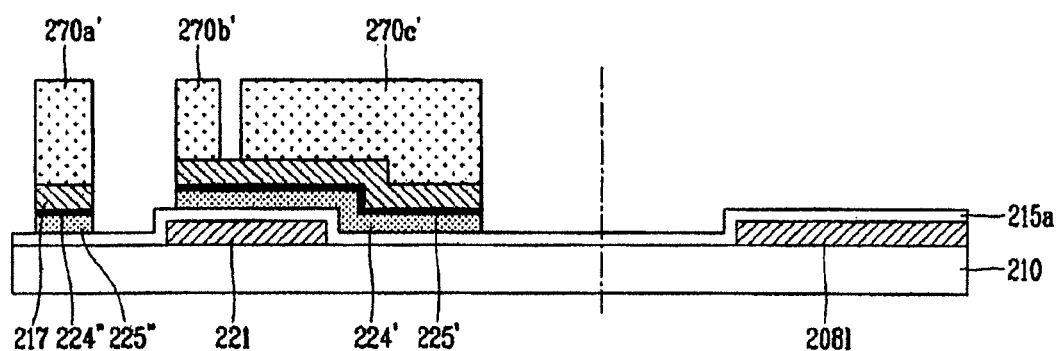

Thereafter, an ashing process is performed to remove portions of the photosensitive film patterns 270a to 270d. Then, as shown in FIG. 7D, a certain upper region of the active pattern 224', namely, the fourth photosensitive film pattern at the slit region (II) to which the slit exposure was applied, is completely removed to expose the surface of the second conductive film pattern 250'.

In this case, the first to third photosensitive film patterns remain as fifth to seventh photosensitive film patterns 270a' to 270c' by removing the thickness of the fourth photosensitive film pattern only at the certain region corresponding to the blocking region (III).

Figure 7E:
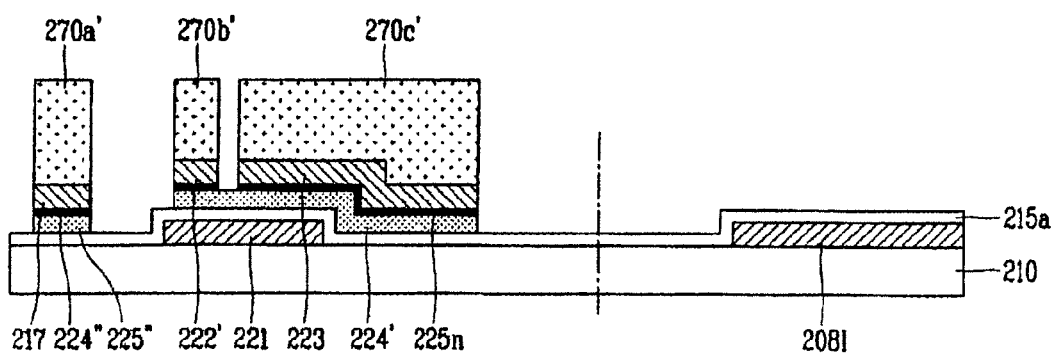

Subsequently, as shown in FIG. 7E, the second conductive film pattern at the upper certain region (namely, the channel region) of the active pattern 224' and the first n+ amorphous silicon thin film pattern are selectively etched by using the remaining fifth to seventh photosensitive film patterns 270a' to 270c' to form the pair of source electrodes 222 and 222' and the drain electrode 223 formed of the second conductive film at the upper portion of the gate electrode 221.

In this case, the first n+ amorphous silicon thin film pattern formed on the active pattern 224' has been patterned according to the shape of the source electrodes 222 and 222' and the drain electrode 223 to form the ohmic-contact layer 225n for allowing the active pattern 224' and the source and drain electrodes 222, 222' and 223 to be ohmic-contacted.

Figure 5C:
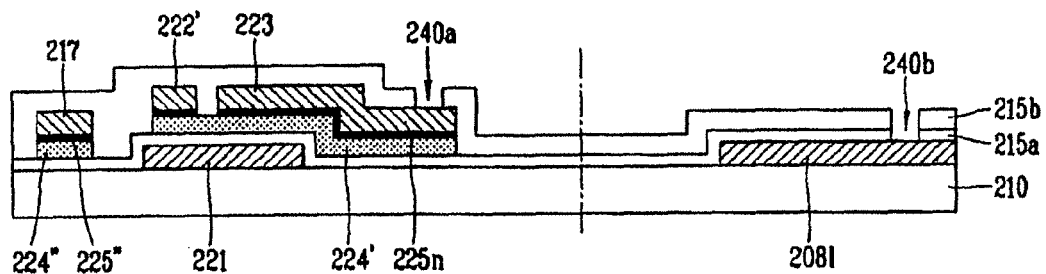
Figure 6C:
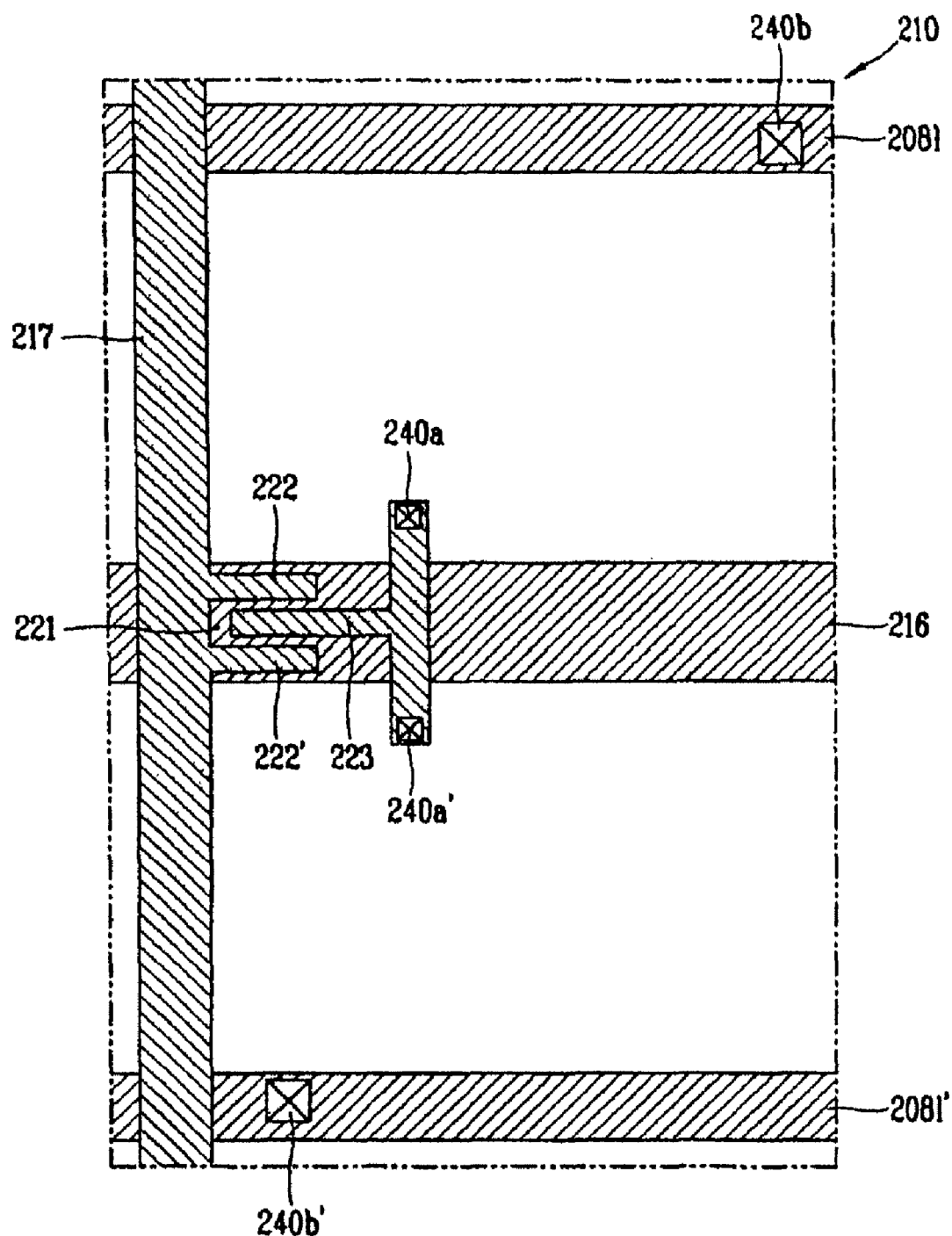

Next, as shown in FIGS. 5C and 6C, a second insulation film 215b is formed on the substrate 210 with the active pattern 224' and the source and drain electrodes 222, 222' and 223' formed thereon, and a portion of the second insulation film 215b is removed by using the photolithography process (a third masking process) to form the upper and lower first contact holes 240a and 240a' exposing a portion of the drain electrode 223, and some portions of the first and second insulation films 215a and 215b are removed to form the upper and lower second contact holes 240b and 240b'.

Figure 5D:
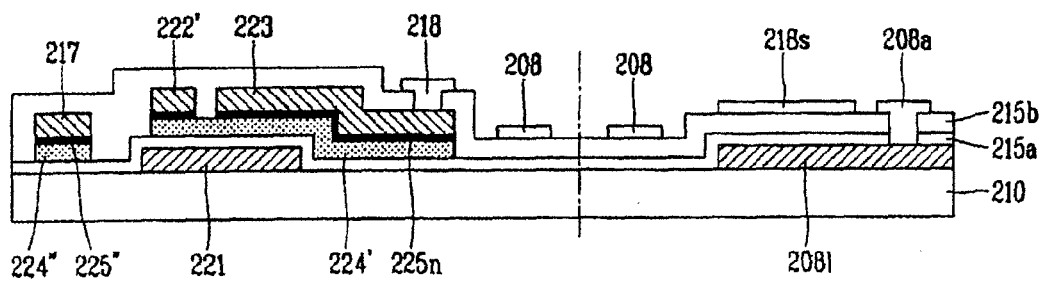
Figure 6D:
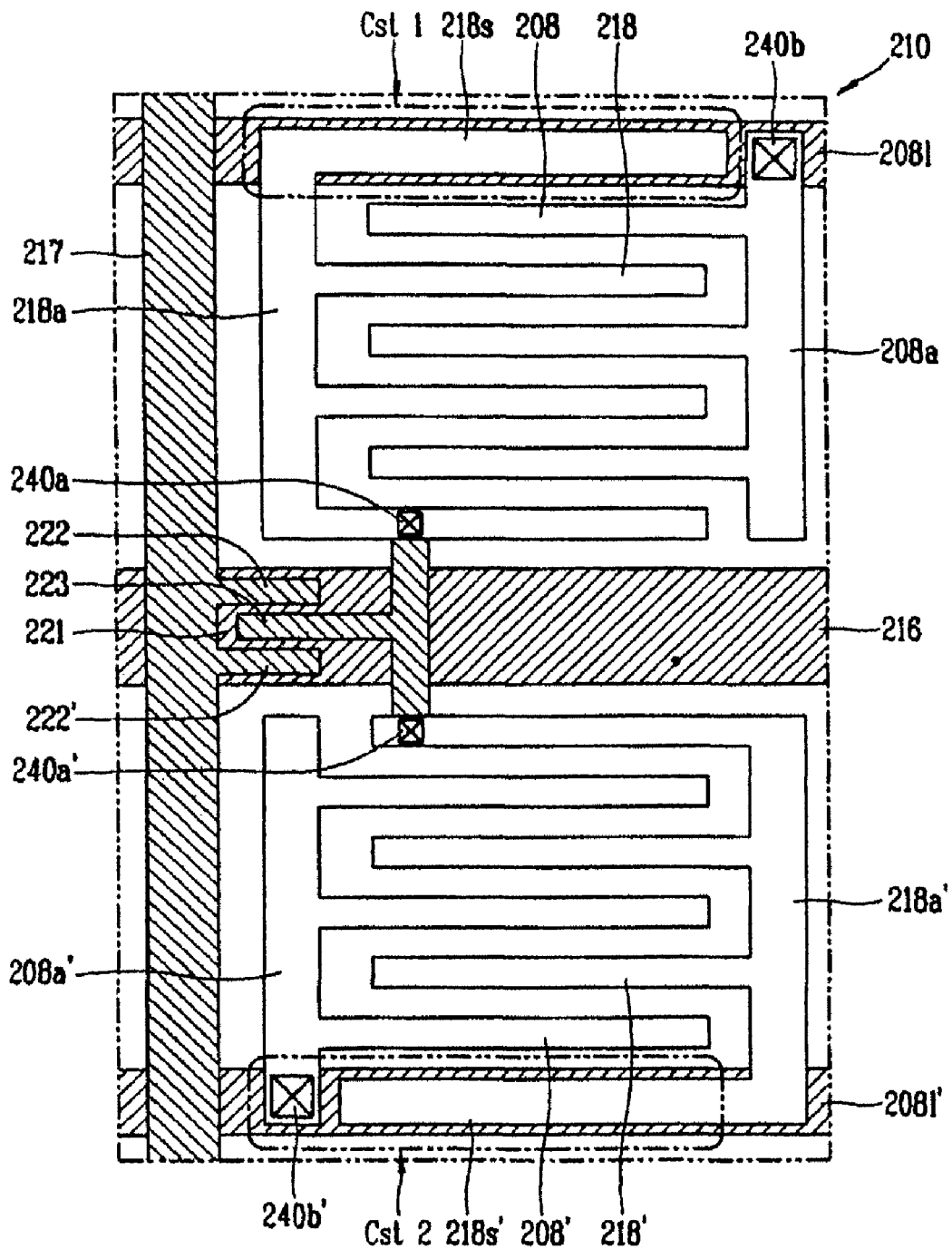

And then, as shown in FIGS. 5D and 6D, a third conductive film is deposited on the entire surface of the substrate 210 and then selectively patterned by using the photolithography (a fourth masking process) to form the plurality of common electrodes 208 and 208', the pixel electrodes 218 and 218', the first connection lines 218a and 218a', the second connection lines 208a and 208a', and the storage electrodes 218s and 218s' formed of the third conductive film.

In this case, the third conductive film can be made of a transparent conductive material such as indium tin oxide (ITO) or indium zinc oxide (IZO).

The pixel electrodes 218 and 218' are electrically connected with the drain electrodes 223 via the first contact holes 240a and 240a', and the second connection lines 208a and 208a' are electrically connected with the common lines 208l and 208l' via the second contact holes 240b and 240b'.

Herein, the common electrodes 208 and 208' and the pixel electrodes 218 and 218' are arranged to be substantially parallel to the gate line 216, and the first connection lines 218a and 218a' and the second connection lines 208a and 208a' are arranged to be substantially parallel to the data line 217. The plurality of pixel electrodes 218 and 218' are connected to the first connection lines 218a and 218a' and the plurality of common electrodes 208 and 208' are connected to the second connection lines 208a and 208a'.

The upper storage electrode 218s overlaps with a portion of the upper common line 208l with the first and second insulation films 215a and 215b interposed therebetween to form the first storage capacitor Cst1, and the lower storage electrode 218s' overlaps with a portion of the lower common line 208l' with the first and second insulation films 215a and 215b interposed therebetween to form the second storage capacitor Cst2.

The thusly constructed array substrate 210 is attached with a color filter substrate (not shown) by a sealant (not shown) formed at edge portions of an image display region to form a liquid crystal display panel, and in this case, the array substrate 210 and the color filter substrate are attached through attachment keys (not shown) formed on the array substrate 210 and the color filter substrate.

In the IPS mode LCD according to the second embodiment of the present invention, the upper first and second connection lines are formed at the left and right sides of the pixel region and the lower first and second connection lines are formed at the right and left sides of the pixel region. But the present invention is not limited thereto, and so long as the first and second connection lines are arranged to crisscross with respect to the upper and lower two regions of the pixel region, the upper first and second connection lines can be formed at right and left sides of the pixel region and the lower first and second connection lines can be formed at the left and right sides of the pixel region, respectively. This will now be described in detail in the following third embodiment of the present invention.

Figure 8:
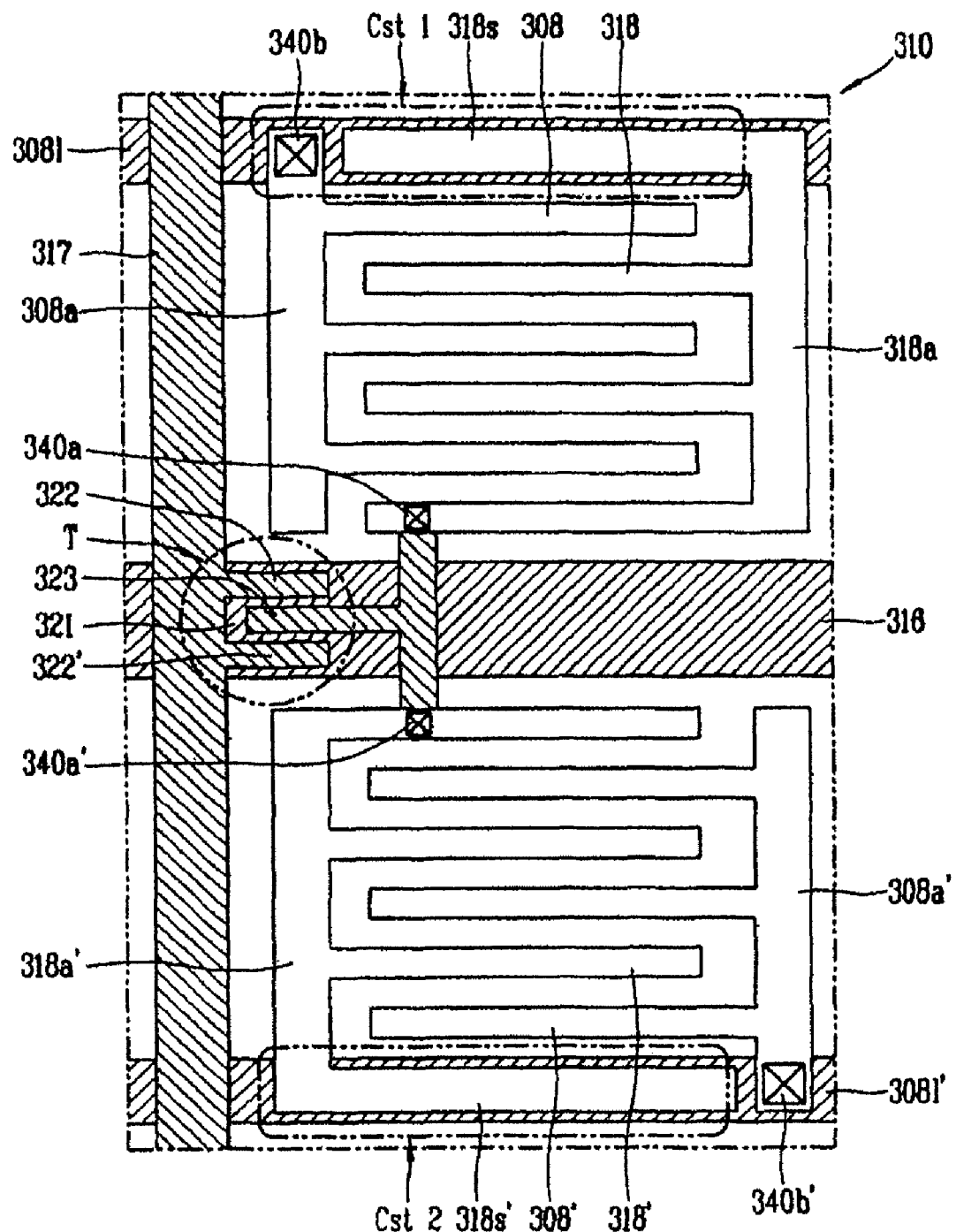
FIG. 8 is a plan view showing a portion of an array substrate of an IPS mode LCD according to a third exemplary embodiment of the present invention.

FIG. 8 is a plan view showing a portion of an array substrate of an IPS mode LCD according to a third embodiment of the present invention.

As shown in FIG. 8, in the third embodiment of the present invention, gate lines 316 and data lines 317 are formed to be arranged vertically and horizontally to define a pixel region on an array substrate 310, and a thin film transistor (TFT) (T), a switching element, is formed at a crossing of the gate line 316 and the data line 317.

The gate line 316 is formed at the center of the pixel region, dividing the pixel region into two upper and lower regions.

The TFT (T) includes a gate electrode 321 forming a portion of the gate line 316, a pair of source electrodes 322 and 322' connected to the data line 317, and a drain electrode 323 connected to pixel electrodes 318 and 318' via first connection lines 318a and 318a'. The TFT (T) also includes a first insulation film (not shown) for insulating the gate electrode 321 and the source and drain electrodes 322, 322' and 323 and an active pattern (not shown) that forms a conductive channel between the source electrodes 322 and 322' and the drain electrode 323 by a gate voltage supplied to the gate electrode 321.

At upper and lower sides of the pixel region divided into two regions by the gate line 316, common lines 308l and 308l' and storage electrodes 318s and 318s' are formed to be substantially parallel to the gate line 316. In addition, in the pixel region, a plurality of common electrodes 308 and 308' and the pixel electrodes 318 and 318' that generate in-plane fields are formed in an alternating pattern. In this case, the common electrodes 308 and 308' and the pixel electrodes 318 and 318' are arranged to be substantially parallel to the gate line 316.

The plurality of pixel electrodes 318 and 318' are connected to the first connection lines 318a and 318a' arranged to be substantially parallel to the data line 317, and the plurality of common electrodes 308 and 308' are connected to the second connection lines 308a and 308a' arranged to be substantially parallel to the data line 317.

In the third embodiment of the present invention, the first connection lines 318a and 318a' for connecting the pixel electrodes and the common lines 308l and 308l' for connecting the common electrodes are arranged to crisscross at the upper and lower portions of the pixel region. Namely, the upper pixel electrode 318 is connected to the upper first connection line 318a at the right edge of the pixel region, and the lower pixel electrode 318' is connected to the lower first connection line 318a' at the left edge of the pixel region. The upper common electrode 308 is connected to the upper second connection line 308a at the left edge of the pixel region, and the lower common electrode 308' is connected with the lower second connection line 308a' at the right edge of the pixel region.

The upper first connection line 318a and the lower first connection line 318' are electrically connected with a portion of the drain electrode 323 via an upper first contact hole 340a and a lower first contact hole 340a' respectively formed at the second insulation film (not shown), and the upper second connection line 308a and the lower second connection line 308a' are electrically connected with the upper common line 308l and the lower common line 308l' via an upper second contact hole 340b and a lower second contact hole 340b' respectively formed at the first and second insulation films.

A portion of the upper common line 308l overlaps with a portion of an upper storage electrode 318s with the first insulation film or the first and second insulation films interposed therebetween, forming a first storage capacity Cst1, and a portion of the lower common line 308l' overlaps with a portion of the lower storage electrode 318s' with the first insulation film or the first and second insulation films interposed therebetween, forming a second storage capacitor Cst2.

In the IPS mode LCD according to the first to third embodiments of the present invention, the common electrodes and the pixel electrodes that generate the in-plane fields in the pixel region are arranged to be substantially parallel to the gate lines. However, the present invention is not limited thereto, and the common electrodes and the pixel electrodes can be arranged to slope at a certain angle with respect to the gate lines. This will be described in detail in a fourth embodiment of the present invention.

Figure 9:
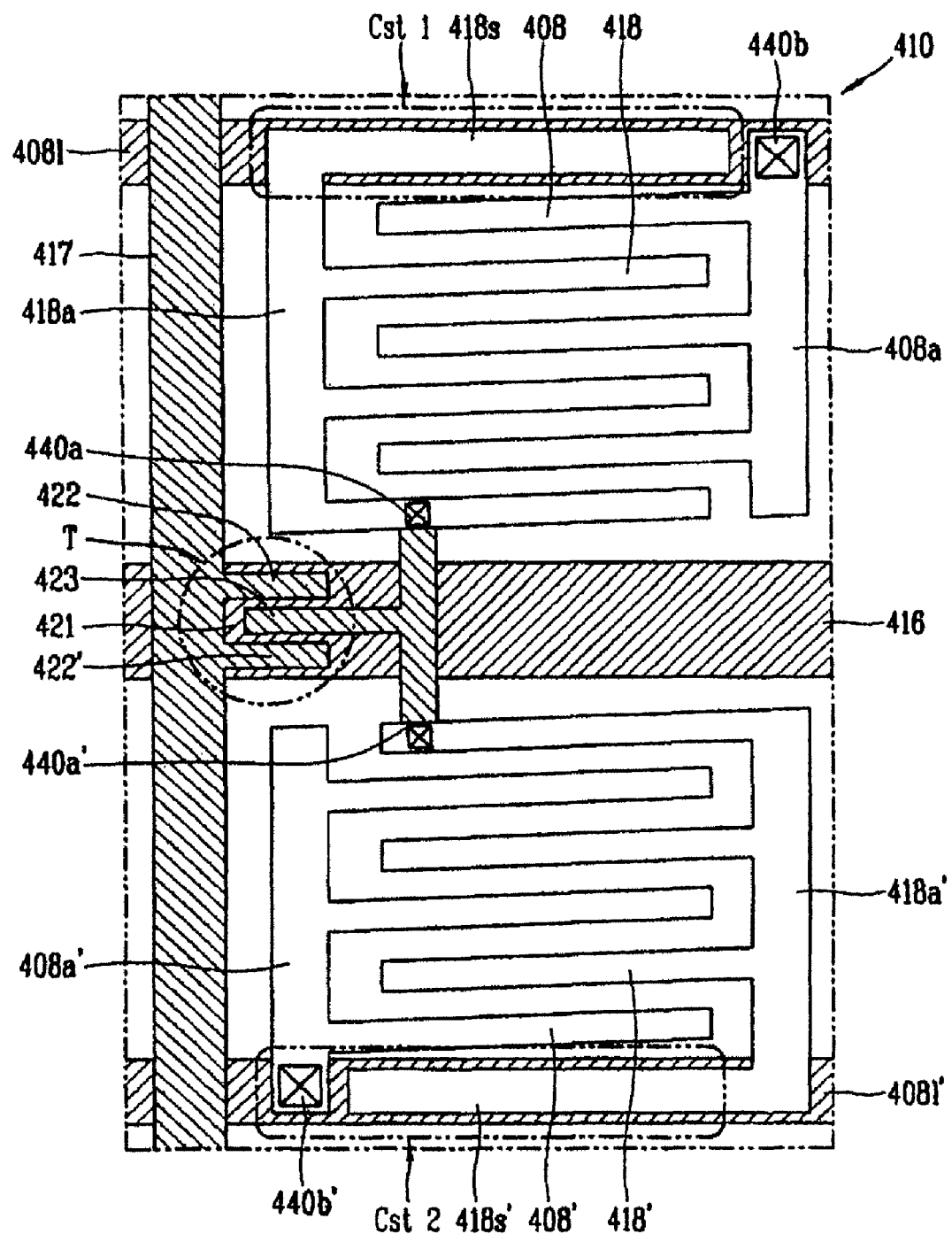
FIG. 9 is a plan view showing a portion of an array substrate of an IPS mode LCD according to a fourth exemplary embodiment of the present invention.

FIG. 9 is a plan view showing a portion of an array substrate of an IPS mode LCD according to the fourth embodiment of the present invention.

As shown in FIG. 9, in the fourth embodiment of the present invention, gate lines 416 and data lines 417 are formed to be arranged vertically and horizontally to define a pixel region on an array substrate 410, and a thin film transistor (TFT) (T), a switching element, is formed at a crossing of the gate line 416 and the data line 417.

The gate line 416 is formed at the center of the pixel region, dividing the pixel region into two upper and lower regions.

The TFT (T) includes a gate electrode 421 forming a portion of the gate line 416, a pair of source electrodes 422 and 422' connected to the data line 417, and a drain electrode 423 connected to pixel electrodes 418 and 418' via first connection lines 418a and 418a'. The TFT (T) also includes a first insulation film (not shown) for insulating the gate electrode 421 and the source and drain electrodes 422, 422' and 423 and an active pattern (not shown) that forms a conductive channel between the source electrodes 422 and 422' and the drain electrode 423 by a gate voltage supplied to the gate electrode 421.

At upper and lower sides of the pixel region divided into two regions by the gate line 416, common lines 408l and 408l' and storage electrodes 418s and 418s' are formed to be substantially parallel to the gate line 416. In addition, at the pixel region, a plurality of common electrodes 408 and 408' and the pixel electrodes 418 and 418' that generate in-plane fields are formed in an alternating pattern.

In this case, the common electrodes 408 and 408' and the pixel electrodes 418 and 418' are arranged to slope at a certain angle (A) with respect to the gate line 416. Herein, the common electrodes 408 and 408' and the pixel electrodes 418 and 418' can be arranged to be substantially parallel to each other, and can be arranged to slope within the range of about $0 < \theta < 45°$.

Although not shown, the gate line 416 can be formed to slope so as to be substantially parallel to the sloped common electrodes 408 and 408' and the pixel electrodes 418 and 418'.

The plurality of pixel electrodes 418 and 418' are connected to the first connection lines 418a and 418a' arranged to be substantially parallel to the data line 417, and the plurality of common electrodes 408 and 408' are connected to the second connection lines 408a and 408a' arranged to be substantially parallel to the data line 417.

Likewise as in the second embodiment of the present invention, in this present fourth embodiment, the upper pixel electrode 418 is connected to the upper first connection line 418a arranged to be substantially parallel to the data line 417 at the left edge of the pixel region, and the lower pixel electrode 418' is connected with the lower first connection line 418a' arranged to be substantially parallel to the data line 417 at the right edge of the pixel region. The upper common electrode 408 is connected to the upper second connection line 408a arranged to be substantially parallel to the data line 417 at the right edge of the pixel region, and the lower common electrode 408' is connected with the lower second connection line 408a' arranged to be substantially parallel to the data line 417 at the left edge of the pixel region.

The upper first connection line 418a and the lower first connection line 418' are electrically connected with a portion of the drain electrode 423 via an upper first contact hole 440a and a lower first contact hole 440a' respectively formed at the second insulation film (not shown), and the upper second connection line 408a and the lower second connection line 408a' are electrically connected with the upper common line 408l and the lower common line 408l' via an upper second contact hole 440b and a lower second contact hole 440b' respectively formed at the first and second insulation films.

A portion of the upper common line 408l overlaps with a portion of an upper storage electrode 418s with the first insulation film or the first and second insulation films interposed therebetween, forming a first storage capacity Cst1, and a portion of the lower common line 408l' overlaps with a portion of the lower storage electrode 418s' with the first insulation film or the first and second insulation films interposed therebetween, forming a second storage capacitor Cst2.

In the first to fourth embodiments of the present invention, as the channel layer, the amorphous silicon TFT using the amorphous silicon thin film is used as an example, but the present invention is not limited thereto and as the channel layer, polycrystalline silicon TFTs using a polycrystalline silicon thin film can be also used.

The present invention can be also applied to a different display device fabricated by using TFTs, for example, an OLED (Organic Light Emitting Diode) display device in which OLEDs are connected to driving transistors.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A method for fabricating an in-plane switching mode liquid crystal display, comprising:
    providing first and second substrates;
    forming a gate electrode and a gate line on the first substrate, and forming an upper common line and a lower common line respectively at upper and lower sides of the gate line;
    forming a first insulation film on the first substrate with the gate electrode, the gate line, the upper common line and the lower common line formed thereon;
    forming an active pattern and source and drain electrodes on the first substrate, and
    forming a data line substantially crossing the gate line to define upper and lower pixel regions;
    forming a second insulation film on the first substrate with the active pattern, the source electrode and the drain electrode formed thereon;
    forming a plurality of upper common electrodes and a plurality of upper pixel electrodes on the second insulation film in the upper pixel region, and forming a plurality of lower common electrodes and a plurality of lower pixel electrodes on the second insulation film in the lower pixel region, wherein the upper and lower common electrodes and the upper and lower pixel electrodes are formed of transparent conductive material on the same layer;
    forming upper first and second connection lines respectively at opposite sides of the upper pixel region on the second insulation film, and forming lower second and first connection lines respectively at opposite sides of the lower pixel region on the second insulation film,
    wherein the upper and lower first connection lines for connecting the upper and lower pixel electrodes are arranged on opposite sides of the respective upper and lower pixel regions, and the upper and lower second connection lines for connecting the upper and lower common electrodes are arranged on opposite sides of the respective upper and lower pixel regions so that the upper and lower first and second connection lines are not wholly affected by a data line of a corresponding pixel or a data line of an adjacent pixel but affected by half of them to thereby improve a luminance change; and
    attaching the first and second substrates.

2. The method of claim 1, wherein the upper and lower common lines are arranged to be substantially parallel to the gate line.

3. The method of claim 1, wherein the gate electrode forms a portion of the gate line.

4. The method of claim 1, wherein the source electrode includes two parts of upper and lower source electrodes formed in a substantially U-shaped channel, wherein the drain electrode is interposed therebetween.

5. The method of claim 1, wherein the upper and lower common electrodes and the upper and lower pixel electrodes are arranged to be substantially parallel to the gate line.

6. The method of claim 1, wherein the common electrodes and the pixel electrodes are arranged to slope at an angle $\theta$ with respect to the gate line.

7. The method of claim 6, wherein the common electrodes and the pixel electrodes are arranged to slope within the range of about $0<\theta<45°$ with respect to the gate line.

8. The method of claim 1, wherein the common electrodes and the pixel electrodes are arranged to be substantially parallel to each other.

9. The method of claim 1, further comprising:
    removing a certain region of the second insulation film to form upper and lower first contact holes exposing a portion of the drain electrode.

10. The method of claim 9, wherein the drain electrode and the upper pixel electrodes are electrically connected via the upper first contact hole, and the drain electrode and the lower pixel electrodes are electrically connected via the lower first contact hole.

11. The method of claim 1, further comprising:
    removing certain regions of the first and second insulation films to form an upper second contact hole exposing a portion of the upper common line and a lower second contact hole exposing a portion of the lower common line.

12. The method of claim 11, wherein the upper second connection line is electrically connected to the upper common line via the upper second contact hole and the lower second connection line is electrically connected to the lower common line via the lower second contact hole.

13. The method of claim 12, wherein the first and second connection lines are arranged to be substantially parallel to the data line.

14. The method of claim 1, further comprising:
    forming an upper storage electrode that overlaps with a portion of the upper common line with the first insulation film or the first and second insulation films interposed therebetween to form a first storage capacitor.

15. The method of claim 1, further comprising:
    forming a lower storage electrode that overlaps with a portion of the lower common line with the first insulation film or the first and second insulation films interposed therebetween to form a second storage capacitor.

* * * * *